United States Patent [19]

Matsuda et al.

[11] 4,434,476
[45] Feb. 28, 1984

[54] MAGNETIC BUBBLE MEMORY DEVICE AND METHOD FOR OPERATING THE SAME

[75] Inventors: Kazuo Matsuda; Makoto Ohashi, both of Kawasaki; Yoshio Satoh, Yokohama; Tsutomu Miyashita; Kazunari Komenou, both of Kawasaki, all of Japan

[73] Assignee: Fujitsu Limited, Kawasaki, Japan

[21] Appl. No.: 408,849

[22] Filed: Aug. 17, 1982

[30] Foreign Application Priority Data

Aug. 17, 1981 [JP] Japan ................................. 56-127710
Aug. 17, 1981 [JP] Japan ................................. 56-127711

[51] Int. Cl.$^3$ ............................................. G11C 19/08
[52] U.S. Cl. ........................................ 365/12; 365/36
[58] Field of Search ................. 365/12, 32, 36, 41

[56] References Cited

U.S. PATENT DOCUMENTS 4,249,249 2/1981 Bonyhard et al. .................... 365/36

FOREIGN PATENT DOCUMENTS

26518 4/1981 European Pat. Off. .............. 365/32
56-80879 7/1981 Japan ..................................... 365/32

*Primary Examiner*—James W. Moffitt
*Attorney, Agent, or Firm*—Staas & Halsey

[57] ABSTRACT

A magnetic bubble memory device includes: a magnetic layer with a first region having an easy axis of magnetization extending in a certain direction and a second region surrounding the first region and having an easy axis of magnetization substantially perpendicular to that of the first region, said first region defining a plurality of bubble propagation patterns; and a replicate gate with a stretch conductor pattern, to which an electric current is applied so as to stretch a bubble between said propagation patterns, and a cutting pattern formed in the second region between the propagation patterns and adapted to lower the bubble collapse field so as to cut the stretched domain. The replicate gate is operated by applying an operating current pulse to the stretch conductor pattern, said operating pulse including a stretch pulse for stretching the bubble and a cut pulse, following the stretch pulse, for cutting the stretched domain.

8 Claims, 18 Drawing Figures

MAGNETIC BUBBLE MEMORY DEVICE AND METHOD FOR OPERATING THE SAME

BACKGROUND OF THE INVENTION

The present invention relates to a magnetic bubble memory device (or bubble device) and a method for operating the same. More particularly, it relates to a replicate gate and a method for operating the same.

In recent years, work has progressed toward the realization of a high density storage magnetic bubble memory device in which the bit period is 4 µm or less, and the memory capacity is 4 Mbits or more. A number of approaches have been proposed to such a high density storage bubble device. A very promising proposal is a bubble device which comprises a magnetic layer having: a first region having an easy axis of magnetization extending in a certain direction; and a second region surrounding the first region and having an easy axis of magnetization substantially perpendicular to that of the first region, the first region defining a plurality of bubble propagation patterns. The propagation patterns (i.e., the first region) of the above-mentioned kind of bubble device may be made by various methods, among which an ion-implantation technique is the most common. In accordance with this technique, ions, such as H, Ne, or He, are implanted into the regions other than the above-mentioned first region (i.e., the propagation patterns) of a magnetic layer having uniaxial anisotropy with the easy axis of magnetization perpendicular to the surface thereof, so as to define the above-mentioned second region. Such a bubble device, in which the propagation patterns are made by using an ion-implantation technique, is usually called an "ion-implanted bubble device".

On the other hand, in bubble memory devices, the replication of bubbles is an important function for realizing non-volatility of stored information. Particularly, in a major-minor loop-organized bubble device, a block replicate system is generally used in which a plurality of replicate gates are disposed between the major line and the respective minor loops and interconnected in series so as to form a block replicate gate by which the information bubbles in the minor loops are replicated, in the block, onto the major line. The block replicate system can provide advantageous features, such as a short cycle time and simple control for information integrity.

However, with the above-described ion-implanted bubble device, it is impossible to use the block replicate system such as used in conventional permalloy bubble devices. That is, the replication of bubbles is accomplished by stretching the bubble and then cutting the stretched domain. In a conventional permalloy bubble device, the bubble can be passively stretched by a permalloy element. However, no method has been found for passively stretching the bubble for an ion-implanted bubble device. Accordingly, the bubble must be actively stretched. Therefore, it is necessary to design a new replicate gate for the ion-implanted bubble device.

There have been proposed some replicate gates which are adapted for use in an ion-implanted bubble device. However, the proposed replicate gates are disadvantageous in that the operating characteristics are insufficient and the construction and the manufacturing process are complicated, as will be described hereinafter with reference to the drawings. In particular, it is difficult to provide a block replicate gate able to be disposed in the small area defined between the major line and the minor loops. These disadvantages make it difficult to realize a 4 µm or less period bubble device whose chip architecture is compatible to that of the present permalloy bubble device.

SUMMARY OF THE INVENTION

It is, therefore, a principal object of the present invention to provide a magnetic bubble memory device of the aforementioned type having a replicate gate which has superior operating characteristics and which can be manufactured by a simple process.

Another object of the present invention is to provide a method for operating the replicate gate in the above-mentioned bubble device so as to realize superior operating characteristics.

According to the present invention, there is provided a bubble device of the aforementioned type which further comprises a replicate gate including: a stretch conductor pattern to which an electric current is applied so as to stretch a bubble between the propagation patterns; and a cutting pattern formed in the second region between the propagation patterns and adapted to lower the bubble collapse field so as to cut the stretched magnetic domain.

According to another aspect of the present invention, there is provided a method for operating the replicate gate in the bubble device of the aforementioned type by which an operating pulse of electric current is applied to the stretch conductor pattern, the operating pulse being composed of a stretch pulse for stretching the bubble and a cut pulse, following the stretch pulse, for cutting the stretched domain.

The present invention will now be described in detail based on the preferred embodiments and in contrast with the prior art, with reference to the accompanying drawings.

DETAILED DESCRIPTION OF THE PREFERRED EMBODIMENTS

First, the prior art will be described with reference to FIGS. 1 through 4.

Figure 1:
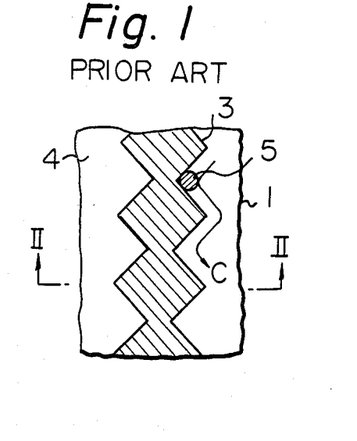
FIG. 1 is a partial plan view of an ion-implanted bubble propagation pattern.
Figure 2:
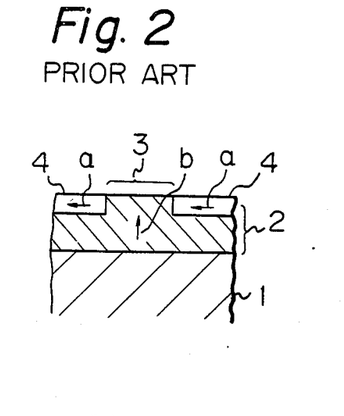
FIG. 2 is a sectional view taken along the line II-II in FIG. 1.

FIGS. 1 and 2 illustrate a magnetic bubble propagation pattern formed by using an ion-implantation technique. Reference numeral 1 designates a substrate of gadolinium gallium garnet on which a thin layer 2 of magnetic garnet is deposited by the technique of liquid-phase epitaxial growth. The magnetic layer 2 has a first region 3 and a second region 4 surrounding the first region. In the second region 4, ions, such as H, Ne, or He, are implanted. This second ion-implanted region 4 has an easy axis of magnetization which is in the plane of the layer 2, as shown by the arrow a. On the other hand, the first non-implanted region 3 has an easy axis of magnetization which is normal to the plane of the layer 2, as shown by the arrow b. A magnetic bubble 5 is moved along the periphery of the first region 3 by means of a magnetic drive field rotating in the plane of the layer 2, as illustrated by the arrow c. Therefore, the first region 3 defines a bubble propagation pattern. This bubble propagation pattern is, in principle, a contiguous pattern which may be composed of a plurality of overlapping disks or square patterns and, therefore, requires no gap, unlike a conventional permalloy propagation pattern. This feature makes it possible to relax the lithographic requirement, and, accordingly, it is possible to provide a smaller propagation pattern and a higher density of storage.

Figure 3:
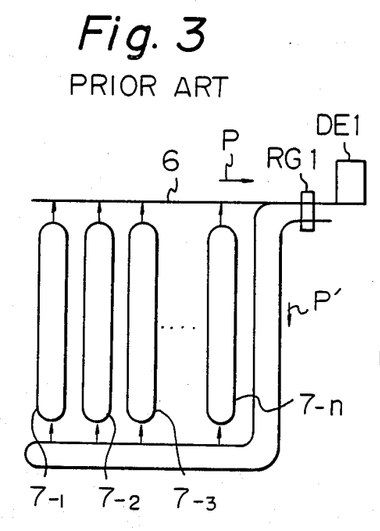
FIG. 3 schematically illustrates a conventional ion-implanted bubble device.

FIG. 3 illustrates a conventional ion-implanted bubble device with major-minor loop organization. In FIG. 3 are illustrated a major line 6, minor loops 7 (7-1 through 7-n), a replicate gate RG1, and a detector DE1. Information in this bubble device is read out in the following manner. First, a train of information bubbles (not illustrated) stored in the minor loops 7 is transferred to the major line 6. The train of bubbles is then propagated to the replicate gate RG1 along the major line 6, as illustrated by the arrow P, and the bubbles are successively divided by the replicate gate RG1 so that another train of bubbles is duplicated. One train of bubbles is detected by the detector DE1, so that the readout of information is performed. Another train of bubbles is returned to the minor loops 7, as illustrated by the arrow P', whereby the non-volatility of information can be achieved. This device, however, has disadvantages; that is, the cycle time is longer than that of a conventional permalloy bubble device with block replicate organization, and needs complicated peripheral circuit for data integrity.

Figure 4:
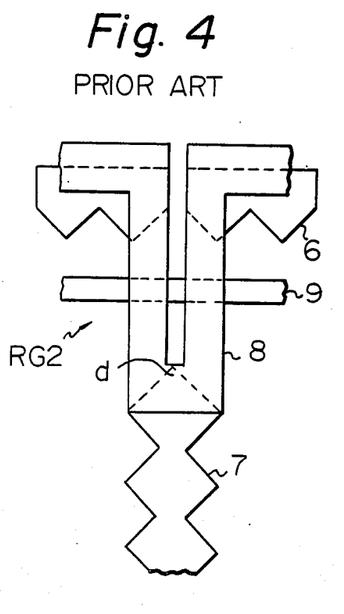
FIG. 4 illustrates a conventional replicate gate.

FIG. 4 illustrates a conventional replicate gate which can be used in an ion-implanted bubble device. This replicate gate RG2 comprises a hairpin-shaped conductor pattern 8 extending between the major line 6 and the end of the minor loop 7 and a bubble-cutting element 9 extending across the conductor pattern 8. The bubble-cutting element 9 is made in the form of a conductor pattern or a recess in which the bubble collapse field is low. In the example in which the element 9 is in the form of a conductor pattern, when the bubble reaches the end d of the minor loop 7, an electric current is applied to the conductor pattern 8 so that the bubble is stretched. Successively, an electric current is applied to the conductor pattern 9 in the direction of collapse of the bubble so that the domain is divided into two parts, one part being attracted to the major line 6 and the other part being attracted to the minor loop 7. In the example in which the element 9 is in the form of a recess, the bubble is stretched by the conductor pattern 8 and then the electric current is turned off so that the domain is divided by the recess 9. However, a replicate gate in which the element 9 is in the form of a conductor pattern has a double layer construction of conductor patterns 8 and 9, and the manufacturing process is complicated. On the other hand, in a replicate gate in which the element 9 is in the form of a recess, a process such as etching or ion-milling is required for formation of recess, and the manufacturing process is complicated.

The present invention aims to eliminate the above-mentioned disadvantages in conventional replicate gates. The preferred embodiments of the present invention will now be described with reference to FIGS. 5 through 18.

Figure 5:
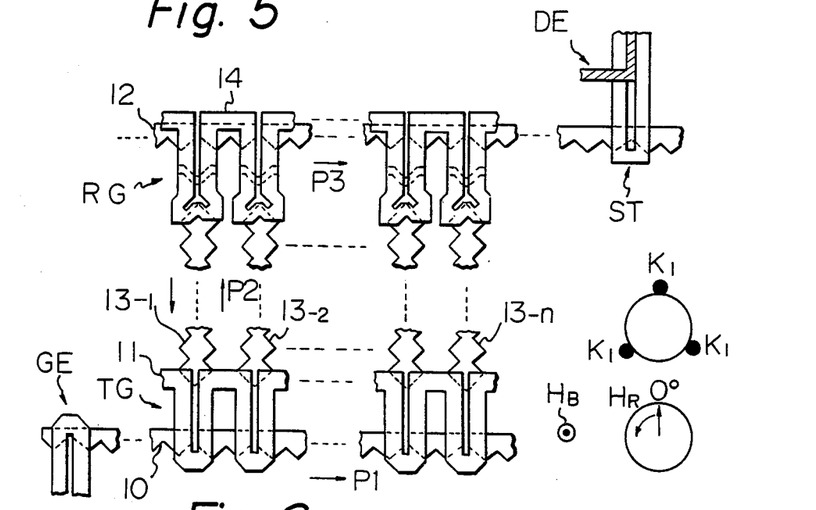
FIG. 5 illustrates an embodiment of a bubble device according to the present invention.

FIG. 5 schematically illustrates an ion-implanted bubble device according to the present invention. This bubble device comprises major lines 10 and 12, minor loops 13 (13-1 through 13-n), a bubble generator GE, a transfer gate TG, a replicate gate RG, a bubble stretcher ST, and a bubble detector DE. Moreover, in FIG. 5, $H_B$ designates a bias field, $H_R$ designates a counterclockwise rotating in-plane magnetic drive field, and $K_1$ designates strip-out easy axis.

The general operation of this bubble device will now be described. The bubble generator GE generates a train of bubbles on the write-in major line 10 in accordance with the information. The train of bubbles on the major line 10 is propagated in the direction of the arrow $P_1$ in response to the rotating drive field $H_R$. When the train of bubbles reaches the position corresponding to the minor loops 13, a current pulse is applied to the hairpin-shaped conductor pattern 11 of the transfer gate TG so that the train of bubbles is transferred to the ends of the minor loops 13, and the write-in of information from the major line 10 into the minor loops 13 is performed. The bubbles written into the minor loops 13 are circularly propagated along the peripheries of the minor loops 13, as illustrated by the arrow $P_2$, in response to the rotating drive field $H_R$. When the bubbles reach the appropriate positions on the minor loops 13, the replicate gate RG is operated so that the bubbles on the minor loops 13 are replicated onto the readout major line 12 as described hereinafter. The replicated bubbles on the major line 12 are propagated in the direction of the arrow $P_3$ in response to the rotating drive field $H_R$ and are detected by the stretcher ST and the detector DE. Thereby, the readout of information is performed. On the other hand, the bubbles on the minor loops 13 are maintained therein, thereby realizing non-volatility of the bubble device. It should be noted that the replicate gate RG also has the function of transferring the bubbles on the minor loops 13 to the major line 12. Such a replicate gate is usually called a "replicate-transfer gate" but is referred to as a "replicate gate" in the present application.

Figure 6:
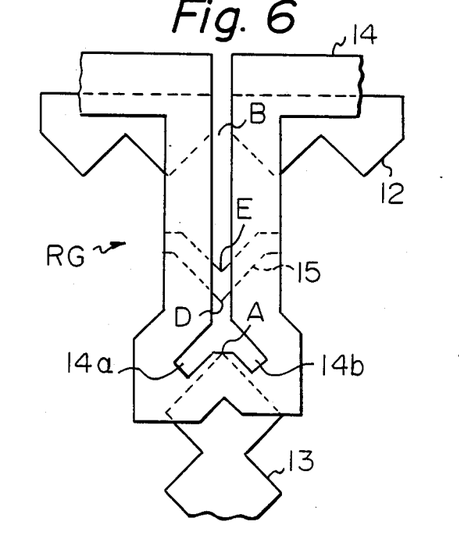
FIG. 6 is an enlarged partial view of the replicate gate of the embodiment illustrated in FIG. 5.

Referring to FIG. 6, the replicate gate RG is composed of a hairpin-shaped conductor pattern 14 to which an electric current is applied so as to stretch bubbles, and a V- or chevron-shaped pattern for cutting the stretched magnetic domain. The cutting pattern 15 is similar to the bubble propagation patterns defining the major lines 10 and 12 and the minor loops 13, defined by the non-implanted region surrounded by the ion-implanted region. The cutting pattern 15 is disposed between the major line 12 and the end of the minor loop 13, and the conductor pattern 14 is arranged to extend between the end A of the minor loop 13 and the cusp B of the major line 12 across the cutting pattern 15.

Figure 7:
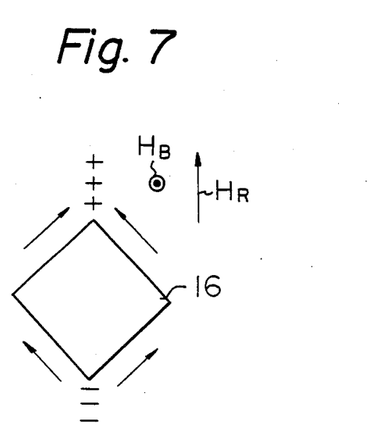
FIG. 7 illustrates the principle of operation in a bubble cutting pattern of the replicate gate illustrated in FIG. 6.

The function of the cutting pattern 15 is based on the principle described below. Referring to FIG. 7, reference numeral 16 designates a diamond-shaped non-implanted pattern which is surrounded by an ion-implanted region. When the bias field $H_B$ and the in-plane field $H_R$ are applied to the pattern 16 as illustrated in FIG. 7, a diverging or negative (−) charged wall and a converging or positive (+) charged wall, which charged walls extend from the edges of the pattern 16 in the direction parallel to the in-plane field $H_R$, are created in the ion-implanted region. A magnetic bubble is repelled by the negative charged wall and is attracted to the positive charged wall. The charged walls move along the periphery of the pattern 16 in response to the rotation of the in-plane field $H_R$, and, accordingly, the bubble is also moved along the periphery of the pattern 16. This is the principle of bubble propagation in the ion-implanted bubble device. Furthermore, the negative charged wall has the effect of lowering the bubble collapse field. That is, it is possible to cut the bubble by using the negative charged wall. Therefore, the cutting pattern 15 is so designed that when the rotating field $H_R$ is at a phase at which positive charged walls are created at both the end A of the minor loop 13 and the cusp B of the major line 12, negative charged walls are created at the edges D and E of the cutting pattern 15, thereby making it possible to cut the magnetic domain stretched along the conductor pattern 14 between the major line 12 and the minor loop 13, as described in detail hereinafter.

It should be noted that the conductor pattern 14 is provided at the portion thereof adjacent to the end of the minor loop 13 with two notches 14a and 14b extending along the edge of the minor loop 13. This design aims to improve the phase margin.

Figure 8:
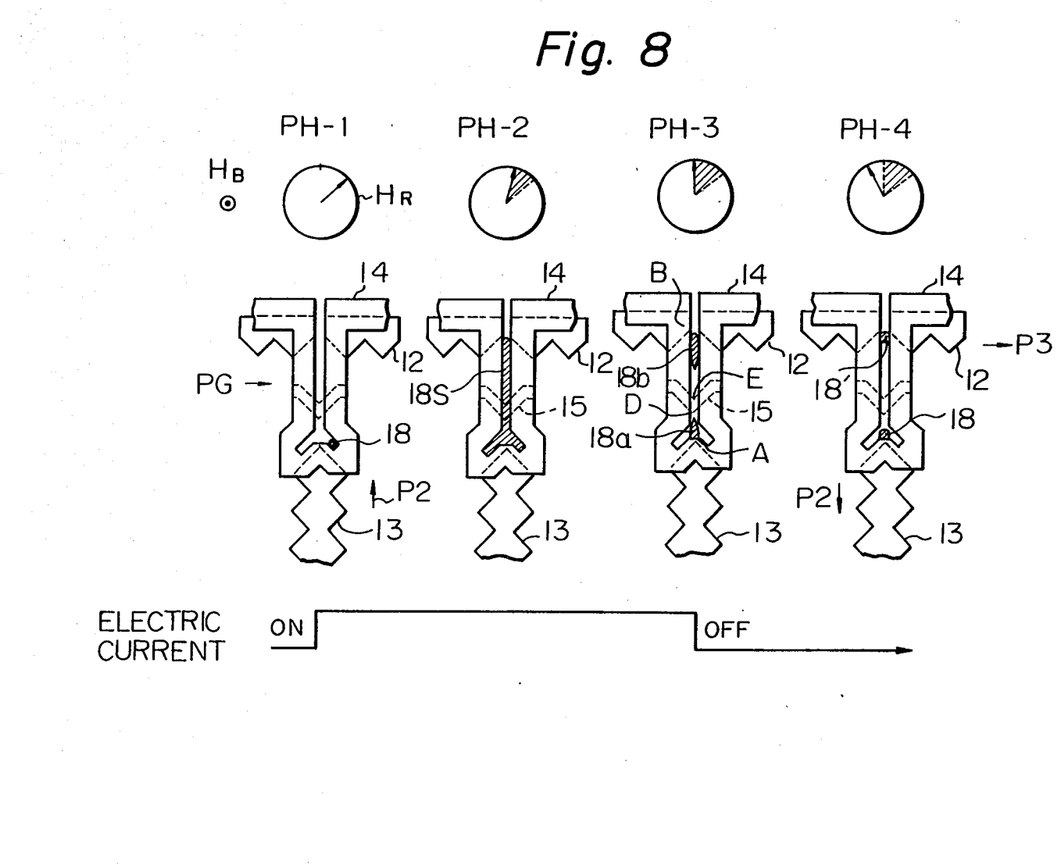
FIG. 8 illustrates the replicate operation in the replicate gate illustrated in FIG. 6.
Figure 9:
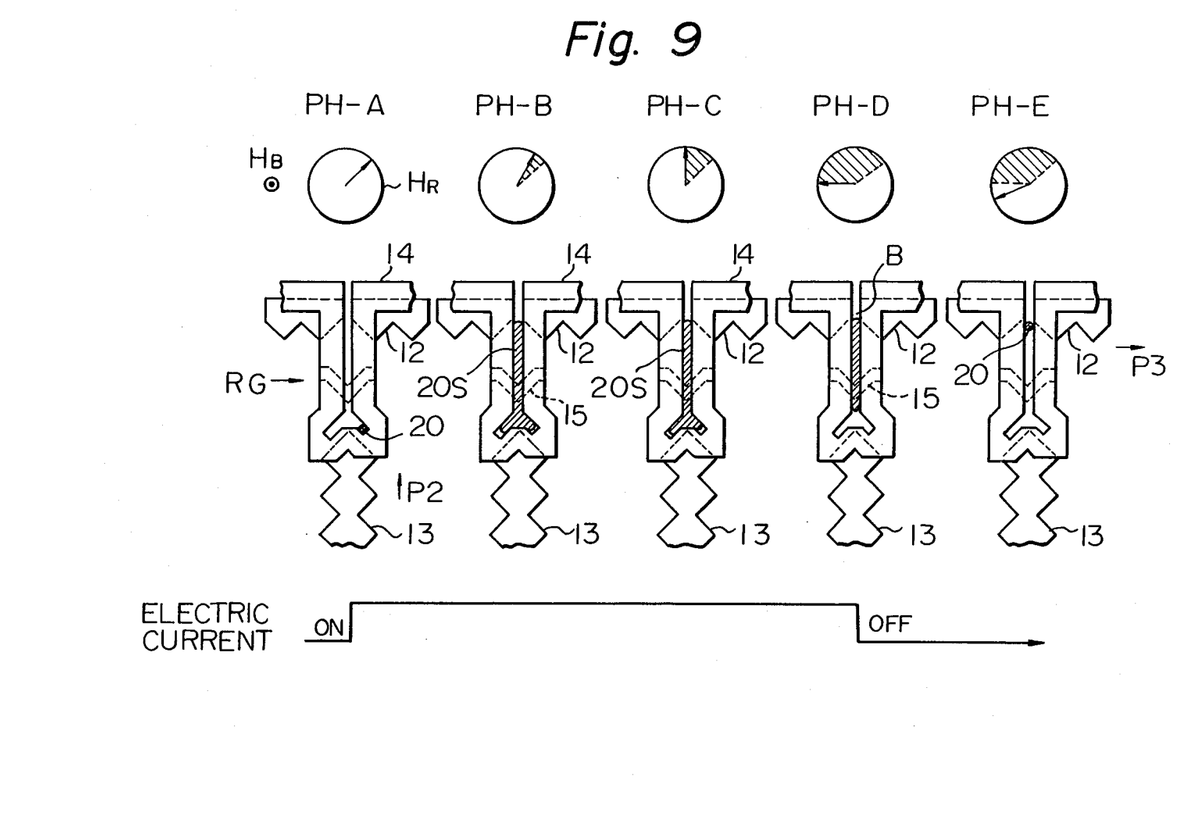
FIG. 9 illustrates the transfer operation in the replicate gate illustrated in FIG. 6.

The replicate operation of the replicate gate RG will now be described with reference to FIG. 8, which illustrates four different states of operation corresponding to the successive phases PH-1, PH-2, PH-3, and PH-4 of the rotating field $H_R$. At the phase PH-1, a bubble 18 comes near to the end A of the minor loop 13 and then an electric current for stretching is applied (ON) to the conductor pattern 14. Accordingly, at the phase PH-2, the bubble is stretched between the minor loop 13 and the major line 12 across the cutting pattern 15, as designated by reference numeral 18S. Thereafter, at the phase PH-3, the stretch current is turned off. As described hereinbefore, at the phase PH-3, positive charged walls are created at the end A of the minor loop 13 and the cusp B of the major line 12, and negative charged walls are created at the edges D and E of the cutting pattern 15. Accordingly, by virtue of the lower collapse field created by negative charged walls, the stretched domain 18S is cut into two parts 18a and 18b. These parts 18a and 18b are attracted to the minor loop 13 and the major line 12, respectively, and, at the phase PH-4, are shrunk to the bubbles 18 and 18′, respectively. In this manner, replication of the bubble 18′ on the major line 12 from the bubble 18 on the minor loop 13 is performed. The bubble 18′ is, as mentioned hereinbefore, propagated along the major line 12 in the direction of the arrow $P_3$ and is detected by the detector DE. On the other hand, the bubble 18 is propagated along the minor loop 13 in the direction of the arrow $P_2$, and thereby non-volatility is realized.

The replicate gate RG can also serve as a transfer gate. The transfer operation of the same will now be described with reference to FIG. 9, which illustrates five different states of operation corresponding to the successive phases PH-A, PH-B, PH-C, PH-D, and PH-E of the rotating field $H_R$. At the phase PH-A, a bubble 20 comes near to the end A of the minor loop 13 and then an electric stretch current is applied (ON) to the conductor pattern 14. Accordingly, at the phase PH-B, the bubble is stretched between the minor loop 13 and the major line 12 across the cutting pattern 15, as designated by reference numeral 20S. The stretched domain 20S is maintained at the phase PH-C. Thereafter, at the phase PH-D, the stretch current is turned off. At the phase PH-D, there is no charged wall parallel to the stretched domain, but a fairly strong magnetically attractive force is created at the cusp B of the major line 12. Accordingly, the stretched domain is not cut but is attracted to the cusp B of the major line 12 and at the phase PH-E is shrunk to the bubble 20. In this manner, the transfer-out of the bubble 20 on the minor loop 13 onto the major line 12 is performed.

Figure 10:
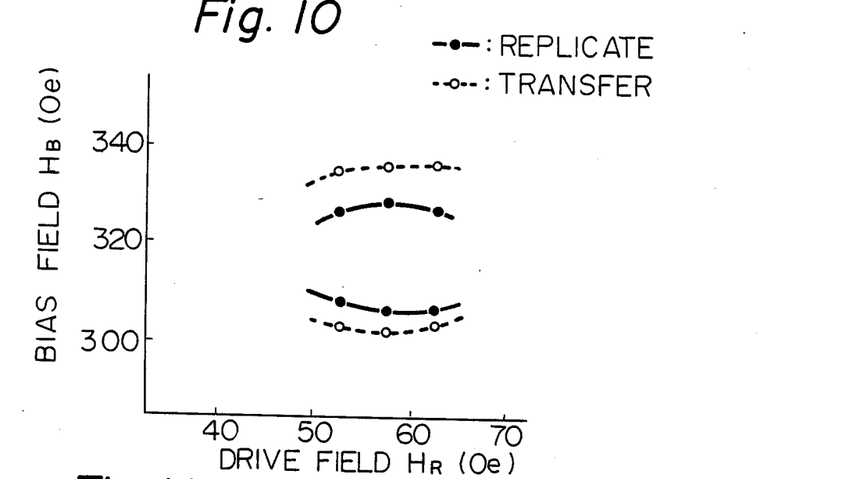
FIG. 10 is a graph illustrating an operating characteristic of the replicate gate illustrated in FIG. 6.

FIG. 10 is a graph illustrating the operating margins of the replicate gate RG. The solid lines show the replicate operation, and the broken lines show the transfer operation.

In the replicate gate RG described above, the cutting pattern 15 defined by the non-implanted region can be formed simultaneously with the formation of the propagation patterns, i.e., the major lines and the minor loops, and, accordingly, the manufacturing process is remarkably simplified as compared with the conventional design illustrated in FIG. 4. Moreover, since cutting of the stretched domain is performed by virtue of the low collapse field created by the negative charged walls created in the non-implanted pattern, it is possible to realize a replicate gate which has superior operating characteristics and is easy to control at a high frequency.

Figure 11:
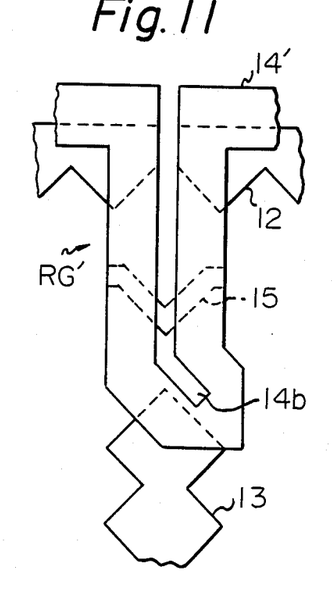
FIG. 11 illustrates a modification of the replicate gate illustrated in FIG. 6.

FIG. 11 illustrates a modification RG′ of the replicate gate RG illustrated in FIG. 6, which is different from the gate RG in that a conductor pattern 14′ is provided with only one notch 14b at the portion thereof adjacent the end of the minor loop 13. This gate RG′ can provide substantially the same operating margin as that obtained by the gate RG. Naturally, it is also possible to remove the notch 14b in FIG. 11.

Figure 12:
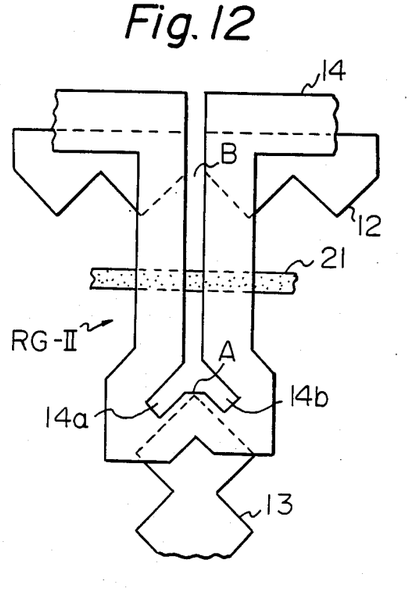
FIG. 12 illustrates another embodiment of the replicate gate according to the present invention.

FIG. 12 illustrates another embodiment of the replicate gate according to the present invention. This replicate gate RG-II is composed of a bubble-stretch conductor pattern 14, which is the same as that of the replicate gate RG illustrated in FIG. 6, and a bubble-cutting pattern 21, which is defined by a paramagnetic region. The paramagnetic region is not a non-implanted region but a region into which ions are over-implanted. The over-implantation of ions causes a reduction in the bubble collapse field in the magnetic layer, thereby making it possible to cut the bubble.

Figure 13:
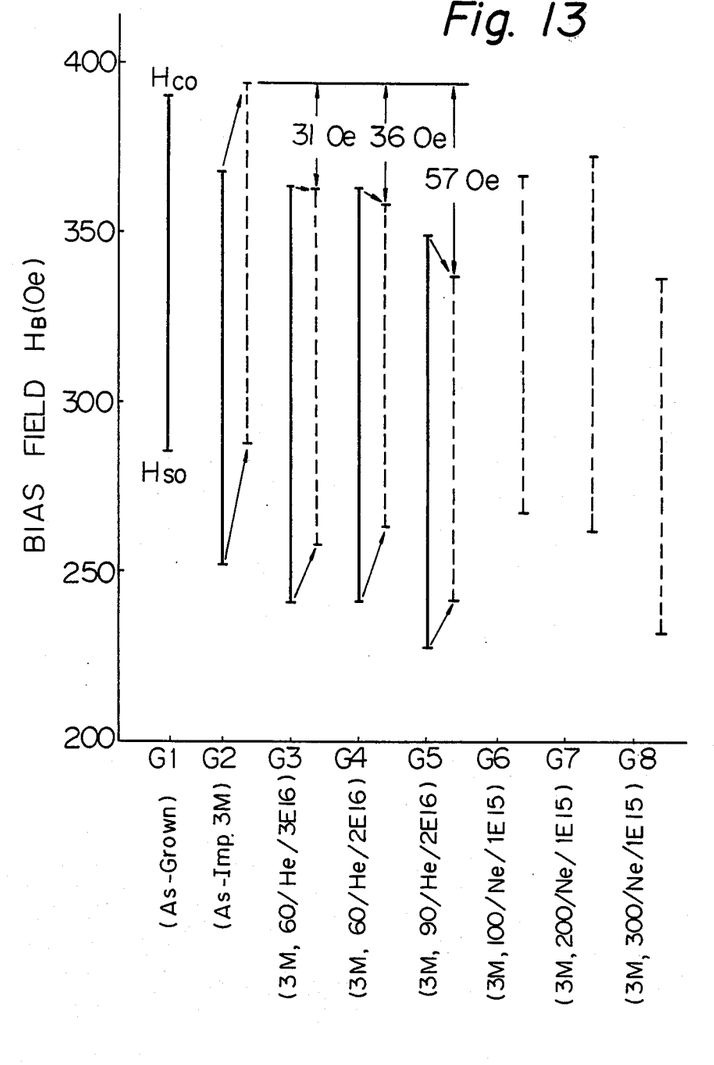
FIG. 13 is a graph illustrating the effect of a reduction in the bubble collapse field due to ion-implantation.

FIG. 13 illustrates experimental data demonstrating a reduction in the collapse field caused by over-implantation. In this figure, the graphs G1 through G8 show the magnetic properties of garnet films under various conditions. Moreover, the top end of each graph indicates a collapse field $H_{CO}$ at which a bubble is collapsed, and the bottom end of each graph indicates a strip-out field $H_{SO}$ at which a bubble is stripped out into a stripe domain. Graph G1 shows the property of the as-grown or non-implanted garnet film. Graph G2 shows the property after tripple ion-implantation (3M) in which, first, Ne+ ions are implanted at an acceleration energy of 50 keV and at a dose of $1 \times 10^{14}/cm^2$ (i.e., 50/Ne/1E14); secondly, Ne+ ions are implanted at an acceleration energy of 200 keV and at a dose of $2 \times 10^{14}/cm^2$ (i.e., 200/Ne/2E14); and thirdly, H+ ions are implanted at an acceleration energy of 50 keV and at a dose of $2 \times 10^{16}/cm^2$ (i.e., 50/H/2E16). Graphs G3 through G8 show the properties after over-implantation of He+ or Ne+, in addition to triple implantation, under various conditions. It should be noted that the broken-line in the graphs G2 through G8 show the properties under the condition annealed at 350° C. in air for 30 minutes after ion-implantation. It will be understood from the figure that the collapse fields in the case in which over-implantation of He+ ions is performed (Graphs G3, G4, and G5) are lower by 31 Oe, 367 Oe, and 57 Oe, respectively, than that in the case in which triple implantation only is performed (Graph G2).

The replicate operation of the replicate gate RG-II illustrated in FIG. 12 is substantially the same as described with reference to FIG. 8 except that cutting of the stretched domain is performed by virtue of a reduction in the collapse field created by an over-implanted paramagnetic region (i.e., cutting pattern 21) and not by virtue of a reduction in the collapse field created by the negative charged wall created by the non-implanted pattern.

In the replicate gate RG-II, the cutting pattern 21 is defined by the over-implanted region, and, accordingly, the manufacturing process is complicated as compared with the first embodiment illustrated in FIG. 6, but fairly simple as compared with the conventional design illustrated in FIG. 4.

Now, in the operation described with reference to FIG. 8, a conventional square-shaped current pulse is used to operate the replicate gate. This operating method, however, has a problem in that the operating margins are insufficient.

Figure 14:
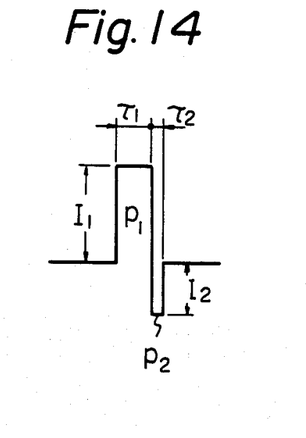
FIG. 14 is a pulse shape for operating the replicate gate, according to the present invention.
Figure 15:
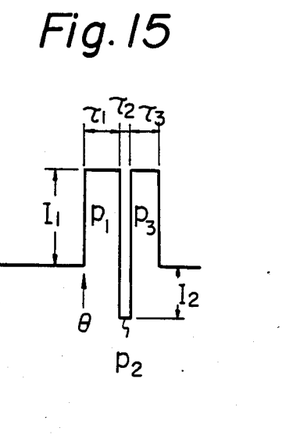
FIG. 15 is another pulse shape for operating the replicate gate, according to the present invention.

In accordance with the present invention, an operating current pulse such as those illustrated in FIGS. 14 and 15 is used to realize an operation which can provide superior operating characteristics. The operating pulse illustrated in FIG. 14 is composed of two pulses $P_1$ and $P_2$. The pulse $P_1$ is a stretch pulse which effects the stretching of a bubble to a stripe domain. The pulse $P_2$ is a cut pulse which ensures rapid and stable cutting of the stretched domain. On the other hand, the operating pulse illustrated in FIG. 15 comprises, in addition to the pulses illustrated in FIG. 14, a second, or additional, stretch pulse $P_3$ which effects stabilization of the magnetic domains. In FIGS. 14 and 15, the widths of the pulses $P_1$, $P_2$, and $P_3$ are designated by $\tau_1$, $\tau_2$, and $\tau_3$, respectively, the current value of the pulses $P_1$ and $P_3$ is designated by $I_1$, and the current value of the pulse $P_2$ is designated by $I_2$.

Figure 16:
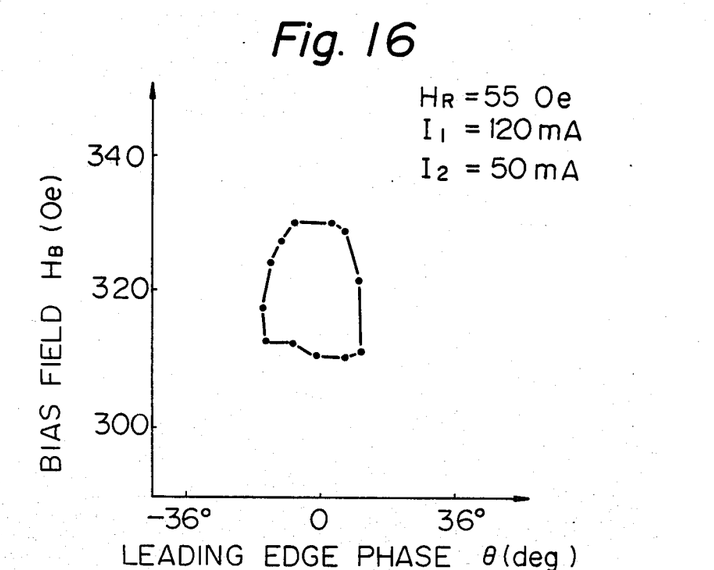
FIGS. 16, 17, and 18 are graphs illustrating various operating characteristics of the replicate gate depending on the current pulse illustrated in FIG. 15.
Figure 17:
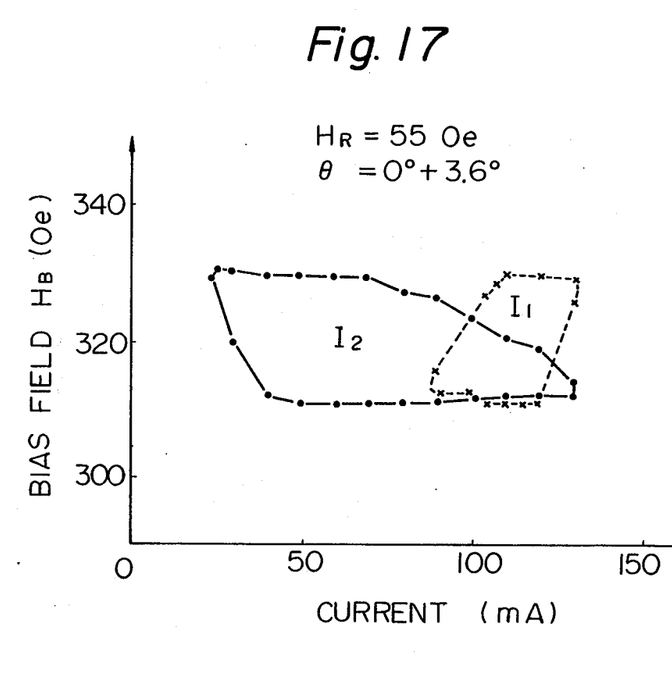
Figure 18:
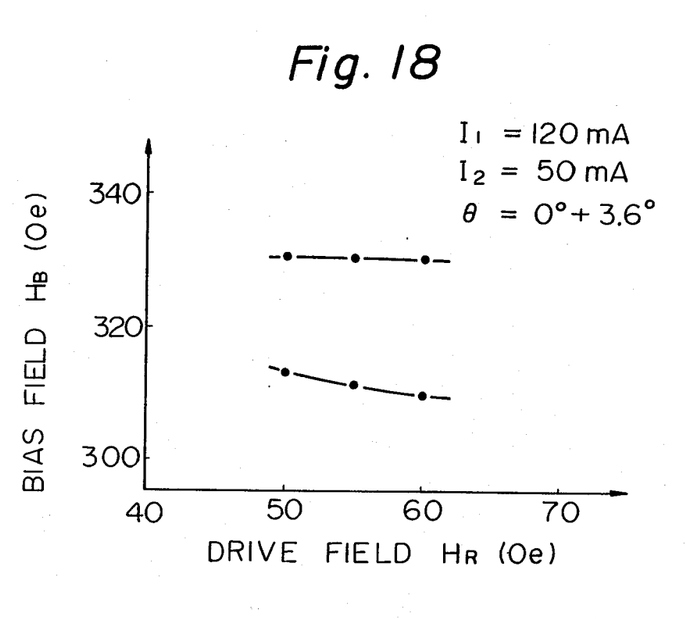

The use of the operating pulse described above makes it possible to provide sufficient operating margins in the replicate operation. FIGS. 16, 17, and 18 illustrate various operating characteristics in the replicate operation of the replicate gate RG (FIG. 6) using the operating pulse illustrated in FIG. 15, wherein the operating frequency is f=100 kHz, $\tau_1 = \tau_3 = 0.3$ μs, and $\tau_2 = 0.04$ μs. FIG. 16 illustrates the bias field margin as a function of the leading edge phase $\theta$ (refer to FIG. 15) of the pulse at the drive field $H_R = 55$ Oe, $I_1 = 120$ mA, and $I_2 = 50$ mA. FIG. 17 illustrates the bias field margin as a function of currents $I_1$ and $I_2$ at $H_r = 55$ Oe and $\theta = 0° + 3.6°$. FIG. 18 illustrates the bias field margin as a function of the drive field $H_R$ at $I_1 = 120$ mA, $I_2 = 50$ mA, and $\theta = 0° + 3.6°$.

It should be noted that substantially the same operating characteristics as described above can also be obtained in the replicate gates RG' and RG-II illustrated in FIGS. 11 and 12, respectively. Moreover, the operating pulse illustrated in FIG. 14 can also provide substantially the same operating characteristics as those provided by the operating pulse illustrated in FIG. 15.

We claim:

1. A magnetic bubble memory device comprising
   a magnetic layer including a first region with an easy axis of magnetization extending in a certain direction, and a second region surrounding said first region and having an easy axis of magnetization substantially perpendicular to that of the first region, said first region defining a plurality of bubble propagation patterns, and
   a replicate gate including a stretch conductor pattern, to which an electric current is applied so as to stretch a bubble between said propagation patterns, and a cutting pattern formed in said second region between said propagation patterns and adapted to lower the bubble collapse field so as to cut the stretched magnetic domain.

2. A device according to claim 1, wherein said cutting pattern is defined by a region having the same easy axis as that of said first region.

3. A device according to claim 2, wherein said first region and said region defining the cutting pattern are regions in which ions are not implanted, and said second region is a region in which ions are implanted.

4. A device according to claim 2, wherein said cutting pattern is V-shaped.

5. A device according to claim 1, wherein said cutting pattern is defined by a paramagnetic region.

6. A device according to claim 5, wherein said first region is a region in which ions are not implanted, said second region is a region in which ions are implanted, and said paramagnetic region is a region in which ions are over-implanted.

7. A method for operating a magnetic bubble memory device, said magnetic bubble memory device comprising:
   a magnetic layer including a first region having an easy axis of magnetization extending in a certain direction, and a second region surrounding said first region and having an easy axis of magnetization substantially perpendicular to that of the first region, said first region defining a plurality of bubble propagation patterns, and
   a replicate gate including a stretch conductor pattern, to which an electric current is applied so as to stretch a bubble between said propagation patterns, and a cutting pattern formed in said second region between said propagation patterns and adapted to lower the bubble collapse field so as to cut the stretched magnetic domain,
   said method comprising applying an operating current pulse to said stretch conductor pattern, said operating pulse including a stretch pulse for stretching the bubble and a cut pulse, following said stretch pulse, for cutting the stretched domain.

8. A method according to claim 7, wherein said operating pulse further comprises an additional stretch pulse, following said cut pulse, for stabilizing the bubbles.

* * * * *

UNITED STATES PATENT AND TRADEMARK OFFICE
CERTIFICATE OF CORRECTION

PATENT NO. : 4,434,476
DATED : 28 February 1984
INVENTOR(S) : Matsuda et al

It is certified that error appears in the above-identified patent and that said Letters Patent is hereby corrected as shown below:

Column 7, line 21, "367" should be --36--.

Signed and Sealed this

Third Day of July 1984

[SEAL]

Attest:

GERALD J. MOSSINGHOFF

Attesting Officer

Commissioner of Patents and Trademarks